United States Patent
Takayanagi et al.

(10) Patent No.: US 11,320,504 B2
(45) Date of Patent: May 3, 2022

(54) OPEN-TYPE MAGNETIC RESONANCE IMAGING APPARATUS

(71) Applicant: HITACHI, LTD., Tokyo (JP)

(72) Inventors: Taisuke Takayanagi, Tokyo (JP); Manabu Aoki, Tokyo (JP); Yukinobu Imamura, Tokyo (JP); Hiroyuki Takeuchi, Tokyo (JP)

(73) Assignee: FUJIFILM HEALTHCARE CORPORATION, Chiba (JP)

( * ) Notice: Subject to any disclaimer, the term of this patent is extended or adjusted under 35 U.S.C. 154(b) by 0 days.

(21) Appl. No.: 17/195,796

(22) Filed: Mar. 9, 2021

(65) Prior Publication Data

US 2021/0333341 A1    Oct. 28, 2021

(30) Foreign Application Priority Data

Apr. 27, 2020    (JP) .............................. JP2020-077951

(51) Int. Cl.
*G01R 33/385*    (2006.01)
*G01R 33/3875*   (2006.01)
*G01R 33/30*     (2006.01)
*G01R 33/421*    (2006.01)

(52) U.S. Cl.
CPC ........... *G01R 33/385* (2013.01); *G01R 33/30* (2013.01); *G01R 33/3875* (2013.01); *G01R 33/4215* (2013.01)

(58) Field of Classification Search
CPC .. G01R 33/385; G01R 33/30; G01R 33/3875; G01R 33/4215; G01R 33/383; G01R 33/3806
See application file for complete search history.

(56) References Cited

FOREIGN PATENT DOCUMENTS

| JP | 05-182821 A | 7/1993 |
| JP | 3983984 B2 * | 9/2007 |
| JP | 2016-096829 A | 5/2016 |
| WO | WO-2016208547 A1 * | 12/2016 ............... A61B 5/05 |

* cited by examiner

*Primary Examiner* — G. M. A Hyder
(74) *Attorney, Agent, or Firm* — Mattingly & Malur, PC (57) ABSTRACT

An open-type MRI apparatus includes a pair of static magnetic field magnets and a pair of gradient magnetic field coils. Each static magnetic field magnet includes a discoid magnetic pole configured to generate a static magnetic field in a Z axis direction in which the pair of static magnetic field magnets are opposed each other, and an annular magnetic pole configured to generate a static magnetic field on an X-Y plane perpendicular to the Z axis direction. Each gradient magnetic field coil includes a Z coil configured to provide a magnetic field being gradient in the Z axis direction in the imaging region, a magnetic material block configured to shield the discoid magnetic pole from a magnetic flux generated from the Z coil, and a correction coil configured to shield the annular magnetic pole from the magnetic flux generated from the Z coil.

15 Claims, 5 Drawing Sheets

OPEN-TYPE MAGNETIC RESONANCE IMAGING APPARATUS

CROSS-REFERENCE TO RELATED APPLICATIONS

The present application claims priority under 35 U.S.C. § 119 to Japanese Patent Application No. 2020-077951, filed on Apr. 27, 2020, the contents of which are hereby incorporated by reference in their entirety.

BACKGROUND OF THE INVENTION

1. Field of the Invention

The present invention relates to an open-type magnetic resonance imaging apparatus.

2. Description of the Related Art

A magnetic resonance imaging apparatus (hereinafter referred to as an MRI apparatus) is an apparatus configured to irradiate a test subject placed in a homogeneous static magnetic field with a radiofrequency pulse and to obtain a cross-sectional image that indicates physical and chemical properties of the test subject by using a nuclear magnetic resonance phenomenon. The MRI apparatus is mainly used for medical purposes.

The MRI apparatus is mainly formed from a static magnetic field magnet, a gradient magnetic field coil, an RF coil, a receiver coil, and a computer system.

The static magnetic field magnet generates a homogeneous static magnetic field in an imaging region into which the test subject is inserted.

The gradient magnetic field coil generates a magnetic field in the form of a pulse, which has an intensity that is spatially gradient, in order to impart position information to captured image data.

The RF coil irradiates the test subject with a radiofrequency pulse and the receiver coil receives a magnetic resonance signal from the test subject.

The computer system renders an image by processing the received signal.

The gradient magnetic field coil also generates a variable magnetic field (a leaked magnetic field) not necessary for imaging outside the imaging region while generating the gradient magnetic field inside the imaging region.

The leaked magnetic field generates an eddy current on a metallic structure, such as the static magnetic field magnet, which constitutes the MRI apparatus.

The eddy current generates the variable magnetic field in the imaging region, thus affecting distribution of the static magnetic field as well as the gradient magnetic field and causing a deterioration in image quality.

Meanwhile, in an open-type MRI apparatus, a magnetic pole made of iron is frequently used for the static magnetic field magnet. The variable magnetic field caused by the leaked magnetic field also affects magnetization of the iron magnetic pole that has a hysteresis property. Meanwhile, a change in magnetization affects the distribution of the static magnetic field as well as the gradient magnetic field, and causes a deterioration in image quality.

Given the circumstances, an MRI apparatus in recent years adopts a mode of suppressing a leaked magnetic field to its metallic structure by using a gradient magnetic field coil of a self-shielded type, that is, a coil provided with an active shield.

A problem of the gradient magnetic field coil provided with the active shield is a necessity to locate the static magnetic field magnet away from the gradient magnetic field coil and from an imaging region by an amount equivalent to a thickness of the shield. Accordingly, this configuration may require an increase in magnetic energy of the static magnetic field magnet and result in an expansive MRI apparatus.

In the meantime, the gradient magnetic field coil configured as described above has large inductance and requires a high-output drive power supply. This is another reason that the MRI apparatus may become expensive.

Japanese Patent Application Publications No. 05-182821 (Patent Document 1) and No. 2016-96829 (Patent Document 2) are related arts in the above-mentioned technical field, which pertain to an open-type MRI apparatus for a medium-to-low magnetic field (below 0.5 T).

Abstract of Patent Document 1 describes, quote, "PURPOSE: To provide a pole piece composed of constitution, in which the generation of eddy currents is lowered and a graded magnetic field can be increased to specified intensity in a short time without reducing magnetic field uniformity in the air gap of a magnetic field generator for an MRI and a retentivity phenomenon is diminished and a distinct image can be obtained with high sensitivity. CONSTITUTION: A pole piece 10 consists of a laminated silicon steel plate layer 11 formed by members for a plurality of block-shaped pole pieces laminated by using non-oriented silicon steel plates, a rectangular sectional soft-iron made magnetic material ring 12, which is provided around the peripheral section of the laminated silicon steel plate 11, and soft ferrite layers 13, in which members for a large number of block-shaped pole pieces constituted by compression-molding soft ferrite powder in a rectangular plate shape are combined in a discoid shape with adhesives and laid on the top face of the laminated silicon steel plate 11. Accordingly, the magnetic field uniformity of an air gap is easily attained, eddy currents generated in a magnetic pole are lowered even when GC pulses are applied to a graded magnetic field coil, and a retentivity phenomenon is reduced.", unquote, thus disclosing a technique for a magnetic field generator for MRI. Moreover, Patent Document 1 discloses a countermeasure method of providing a magnetic pole piece (such as soft ferrite and a silicon steel plate), which is capable of forming a passage for a magnetic flux and suppressing the occurrence of an eddy current, between a gradient magnetic field coil and a metallic structure.

Abstract of Patent Document 2 describes, quote, "PROBLEM TO BE SOLVED: To provide MRI device comprising a means for obtaining excellent image while improving comfort in subject, in which generation of eddy current magnetic field due to leaked magnetic field and variable magnetic field due to magnetic change are suppressed and broad photographing space is provided in an iron magnetic pole upon generation of inclined magnetic field. SOLUTION: There is provided MRI device comprising a static magnetic field magnet having a magnet as magnetic pole and inclined magnetic field coil. The magnet as magnetic pole opposing to photographing space is constructed with approximately disk shaped iron magnetic pole, approximately ring shaped iron magnetic pole and magnetic pole pieces of tile shaped silicon steel plate. The magnetic pole pieces of tile shaped silicon steel plate is laminated on surface of the disk shaped iron magnetic pole. The disk shaped iron magnetic pole is divided in circumference direction and insulated each other with insulation or gap.", unquote, thus disclosing a technique for a magnetic resonance imaging apparatus. Moreover, Patent Document 2 discloses a method of attenuating a generated eddy current by dividing the magnetic pole in the circumferential direction.

However, the countermeasure method disclosed in Patent Document 1 has a structural difficulty in completely shielding a leaked magnetic field, and therefore has a problem of the occurrence of an eddy current on the disk shaped magnetic pole that constitutes the static magnetic field magnet.

On the other hand, the method disclosed in Patent Document 2 of attenuating the generated eddy current by dividing the magnetic pole in the circumferential direction requires high processing and assembling accuracy in order to divide the magnetic pole while securing homogeneity of the static electric field, and therefore has a problem of an increase in manufacturing cost of the static magnetic field magnet. Meanwhile, effective saturated magnetization is reduced in the case of dividing the magnetic pole and higher magnetic energy is therefore required to achieve a static magnetic field intensity equivalent to that of the static magnetic field magnet which is not divided. As a consequence, this method has a problem of an increase in price of the MRI apparatus.

SUMMARY OF THE INVENTION

The present invention is directed to a low-cost open-type MRI (magnetic resonance imaging) apparatus capable of improving image quality of an MRI image obtained by the open-type MRI apparatus.

To attain the object, the present invention provides the following configuration.

Specifically, an open-type magnetic resonance imaging apparatus according to the present invention includes a pair of static magnetic field magnets opposed to each other with respect to an imaging region, and a pair of gradient magnetic field coils opposed to each other with respect to the imaging region. Each static magnetic field magnet includes a discoid magnetic pole configured to generate a static magnetic field in a Z axis direction in which the pair of static magnetic field magnets are opposed each other, and an annular magnetic pole configured to generate a static magnetic field on an X-Y plane perpendicular to the Z axis direction. Each gradient magnetic field coil includes a Z coil configured to provide a magnetic field being gradient in the Z axis direction in the imaging region, a magnetic material block configured to shield the discoid magnetic pole from a magnetic flux generated from the Z coil, and a correction coil configured to shield the annular magnetic pole from the magnetic flux generated from the Z coil.

Other features of the present invention will be described in the following chapter of detailed description of the embodiments.

According to an open-type magnetic resonance imaging apparatus of the present invention, it is possible to improve image quality of an MRI image by suppressing an eddy current attributed to a leaked magnetic field from a gradient magnetic field coil without having to divide a magnetic pole that constitutes a static magnetic field magnet.

Moreover, a desired magnetic field intensity can be achieved with lower magnetic energy while not requiring high processing and assembling accuracy. Thus, it is possible to provide a low-cost open-type MRI apparatus.

DETAILED DESCRIPTION OF THE EMBODIMENTS

Modes (hereinafter referred to as "embodiments") for carrying out the present invention will be described below with reference to the drawings as appropriate.

First Embodiment

An open-type magnetic resonance imaging apparatus (an open-type MRI apparatus) according to a first embodiment of the present invention will be described with reference to the drawings.

<Cross-Sectional Configuration of Open-Type Magnetic Resonance Imaging Apparatus>

Figure 1:
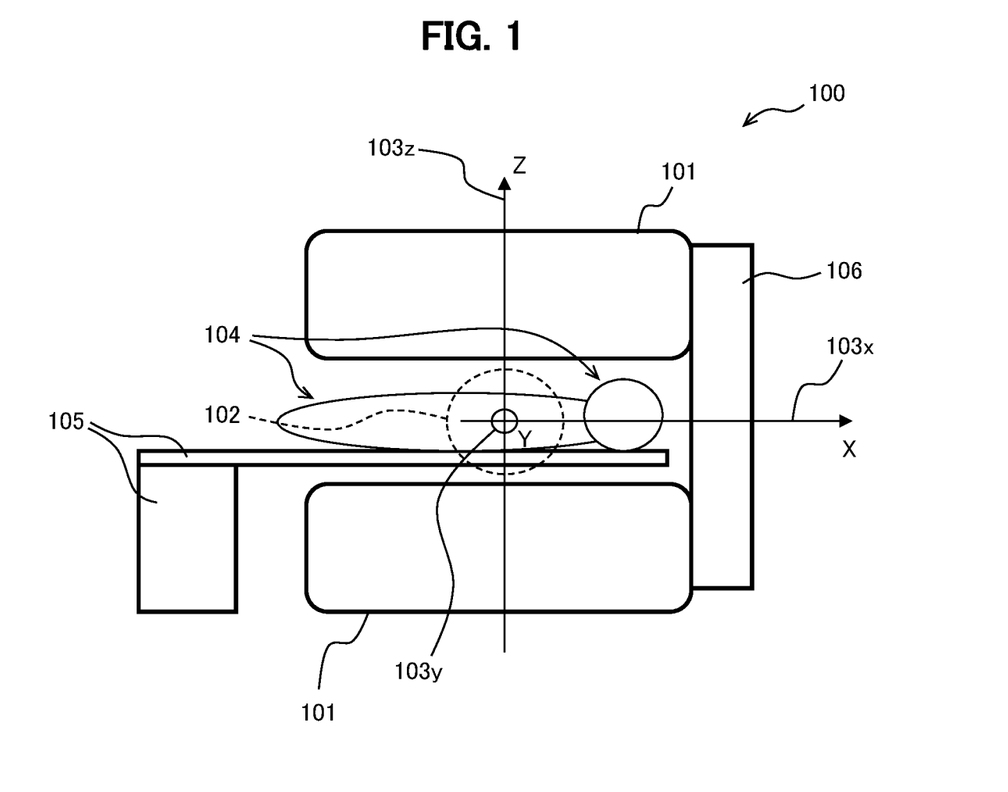
FIG. 1 is a diagram showing a cross-sectional configuration example of an open-type magnetic resonance imaging apparatus according to a first embodiment of the present invention.

FIG. 1 is a diagram showing a cross-sectional configuration example of an open-type magnetic resonance imaging apparatus (hereinafter referred to as an "open-type MRI apparatus") according to a first embodiment of the present invention.

In FIG. 1, an open-type MRI apparatus 100 includes a pair of vertically arranged static magnetic field magnets 101, a support portion 106 that supports and holds the vertical pair of static magnetic field magnets 101, and a movable bed 105.

Meanwhile, a test subject 104 (an examinee or a test body) of the open-type MRI apparatus 100 gets on the movable bed 105. Then, the test subject 104 is placed between the vertical pair of static magnetic field magnets 101 by moving the movable bed 105.

The open-type MRI apparatus 100 drives the vertical pair of static magnetic field magnets 101 and generates a static magnetic field in a direction of Z axis 103z relative to a substantially spherical imaging region (an imaging space) 102 located between the vertical pair of static magnetic field magnets 101.

Here, the Z axis 103z passes through the center of the imaging region 102 as the point of origin. Two axes that cross perpendicularly to the Z axis 103z at the point of origin are defined as X axis 103x and Y axis 103y, respectively.

In the meantime, the imaging region 102 is accompanied by the static magnetic field magnets 101 on an upper side and a lower side (the Z axis direction), but is open in a horizontal direction (a Y axis direction).

As mentioned earlier, the test subject 104 is carried into the imaging region 102 by using the movable bed 105. Then, the open-type MRI apparatus 100 obtains an MRI image of the test subject 104.

The imaging region 102 of the open-type MRI apparatus 100 is not surrounded by structures. Therefore, the test subject 104 can feel freedom as compared to a horizontal magnetic field-type MRI apparatus.

Meanwhile, it is possible to capture an image of an affected area always at the center of the imaging region 102 by moving the movable bed 105. Moreover, the open-type MRI apparatus 100 has an advantage that an operator of the open-type MRI apparatus or the like can assist in capturing the image of the test subject 104 from the outside of the open-type MRI apparatus 100 in the course of capturing the MRI image.

<Configurations of Static Magnetic Field Magnet, Gradient Magnetic Field Coil, and RF Coil>

Figure 2:
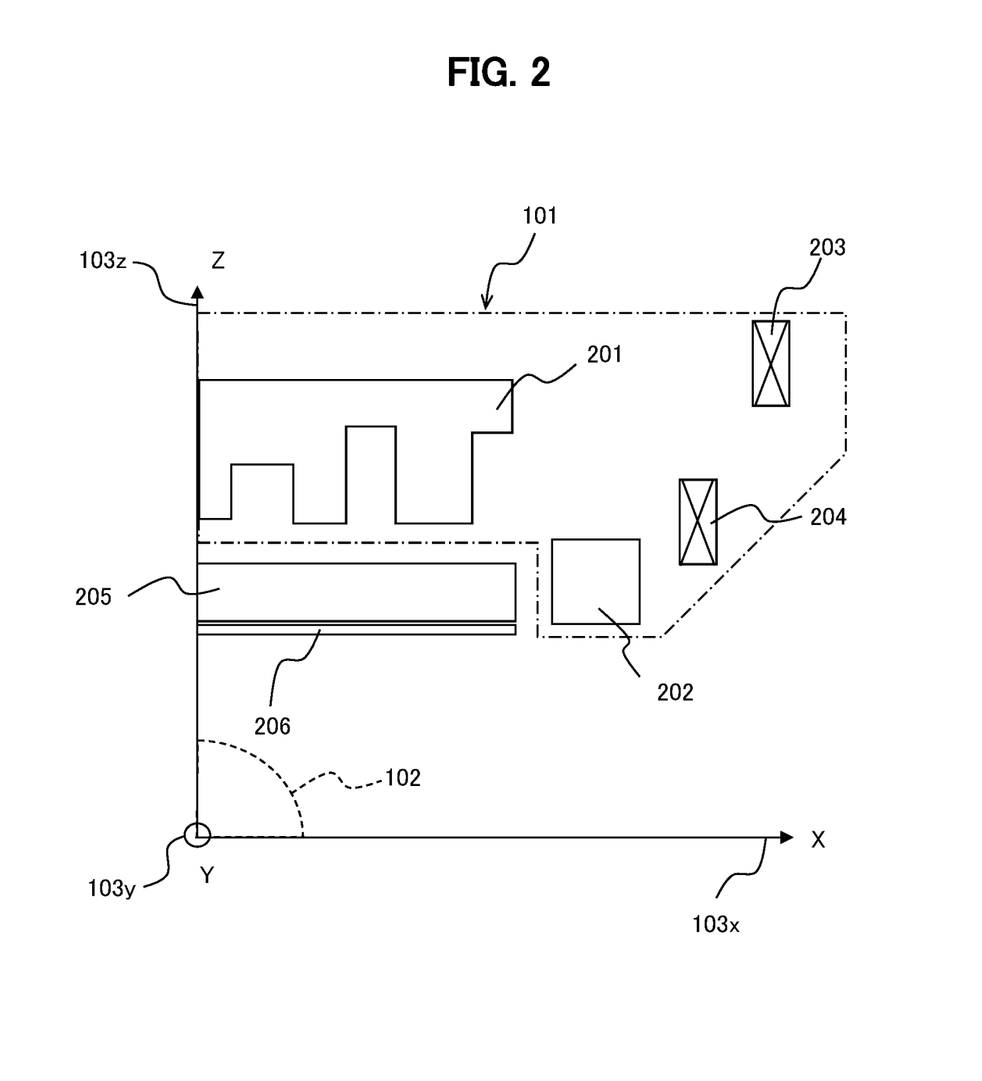
FIG. 2 is a diagram showing a schematic configuration example of a static magnetic field magnet of the open-type magnetic resonance imaging apparatus according to the first embodiment of the present invention and a configuration example of a gradient magnetic field coil and an RF coil arranged in the vicinity of the static magnetic field magnet.

FIG. 2 is a diagram showing a schematic configuration example of the static magnetic field magnet 101 of the open-type magnetic resonance imaging apparatus according to the first embodiment of the present invention, and a configuration example of a gradient magnetic field coil 205 and an RF coil 206 which are arranged in the vicinity of the static magnetic field magnet 101.

The static magnetic field magnet 101, the gradient magnetic field coil 205, and the RF coil 206 are illustrated in FIG. 2.

Moreover, FIG. 2 illustrates the X axis 103x, the Y axis 103y, the Z axis 103z, and the imaging region 102.

Note that FIG. 2 only illustrates an upper side (a positive side on the Z axis) and a right side (a positive side on the X axis) of the vertical pair of static magnetic field magnets 101 for the purpose of simplification.

A configuration inside a region indicated with a dashed line represents the static magnetic field magnet 101. The gradient magnetic field coil 205 and the RF coil 206 will be described later.

Besides, although not illustrated in FIG. 2, the open-type MRI apparatus 100 includes a power supply unit for driving the gradient magnetic field coil 205 and the RF coil 206, and a computer system for controlling the power supply and converting signals obtained by the RF coil 206 (which also serves as a signal receiver coil) into images.

<<Static Magnetic Field Magnet>>

The static magnetic field magnet 101 generates a homogeneous static magnetic field in the imaging region 102 into which the test subject (104: FIG. 1) is inserted.

As shown in FIG. 2, the static magnetic field magnet 101 includes a discoid magnetic pole 201, an annular magnetic pole 202, a shield coil 203, and a main coil 204. Moreover, the static magnetic field magnet 101 includes a not-illustrated return yoke (which is made of an electromagnetic steel plate and has a role for preventing a magnetic line from leaking out).

The static magnetic field magnet 101 has a substantially axisymmetric structure with respect to the Z axis 103z as the center.

The discoid magnetic pole 201 is made of a magnetic material such as iron and formed into a discoid shape located around the Z axis 103z as the center. Nevertheless, the discoid magnetic pole 201 has a given irregular shape in the Z axis direction along the X axis direction in order to generate a desired magnetic field.

The annular magnetic pole 202 is made of a magnetic material such as iron and formed into an annular shape located around the Z axis 103z as the center.

Here, the discoid magnetic pole 201 is formed into the discoid shape while the annular magnetic pole 202 is formed into the annular shape, both of which are formed from the magnetic materials which are neither divided nor provided with any slits. Accordingly, it is easier to manufacture these poles with lower manufacturing costs as compared to the case of dividing the poles.

In addition, since the magnetic materials are not divided, the poles have better magnetic energy efficiency than the divided poles do.

Meanwhile, in FIG. 2, the discoid magnetic pole 201 and the annular magnetic pole 202 form magnetic circuits.

The main coil 204 is formed from a coil having a substantially annular shape located around the Z axis as the center.

By applying electric currents to the vertical pair of main coils 204, respectively, a static magnetic field originating from the vertical pair of static magnetic field magnets 101 is formed to encompass the imaging region 102 by way of the aforementioned magnetic circuits.

The magnetic field formed by the aforementioned magnetic circuits may be leaked and may come into being on the outside of the open-type MRI apparatus (100: FIG. 1). The shield coil 203 in a substantially annular shape, which is configured to generate a magnetic field of an opposite polarity to that in the imaging region, is provided in order to reduce the magnetic field on the outside of the open-type MRI apparatus 100, The shield coil 203 generates the magnetic field having the opposite polarity to that of the magnetic field generated in the imaging region by the aforementioned magnetic circuits, thereby reducing the magnetic field on the outside of the open-type MRI apparatus 100.

Meanwhile, as mentioned earlier, the not-illustrated return yoke also plays the role for reducing the magnetic field on the outside of the open-type MRI apparatus 100.

As described above, the static magnetic field is generated by the main coils 204 each having the substantially annular shape and being made of an electrically conductive material (such as a superconductive material).

When superconductive coils are used for the main coil 204 and the shield coil 203 described above, each coil used for the main coil 204 or the shield coil 203 is housed in a container (not shown) having a heat insulation structure formed from a vacuum container, a radiation shield, a liquid helium container, and the like arranged in this order from the outside, and is kept at an extremely low temperature by using liquid helium, a refrigerator (not shown), and the like.

In FIG. 2, the gradient magnetic field coil 205 is installed on one side of the static magnetic field magnet 101 close to the imaging region 102. The gradient magnetic field coil 205 is configured to generate a gradient magnetic field in a pulse form in the same direction as the Z axis 103z, which is the direction of the static magnetic field, at an intensity proportional to a distance from the center of the imaging region 102.

The RF coil 206 having a substantially discoid shape and configured to generate a radiofrequency electromagnetic pulse (an RF pulse) is installed on one side of the gradient magnetic field coil 205 closer to the imaging region 102.

Next, the gradient magnetic field coil 205 and the RF coil 206 will be described. It is to be noted, however, that the characteristic features of the present invention mainly lie in the static magnetic field magnet 101 and the gradient magnetic field coil 205. Accordingly, an outline of the RF coil 206 will be described first and then the configuration of the gradient magnetic field coil 205 will be described in detail.

«RF Coil»

The RF coil 206 shown in FIG. 2 radiates an electromagnetic wave (an oscillating magnetic field) in a direction perpendicular to the static magnetic field generated by the static magnetic field magnet 101 as a consequence of applying a radiofrequency (RF) alternating current in the form of a pulse to the RF coil 206.

The radiation of electromagnetic wave applies an RF magnetic field (an RF pulse) in the direction perpendicular to the static magnetic field. Though the applied RF pulse is the oscillating magnetic field, a component of this oscillating magnetic field generates the RF magnetic field that rotates about the Z axis.

The rotating RF magnetic field reacts and resonates with spins of various nuclei that constitute the test subject 104, and a status of an aggregate of macroscopic nuclear spins is detected as a signal.

The RF coil 206 has a function to apply the RF magnetic field (the RF pulse or the oscillating magnetic field) in the direction perpendicular to the static magnetic field, and may also have a function as the receiver coil that receives the signal representing the status of reaction and resonance of the various nuclei constituting the test subject (the test body) 104. Otherwise, a receiver coil not illustrated in FIG. 2 may be separately provided.

Here, the signal related to the magnetic resonance that the receiver coil receives from the test subject 104 is sent to a not-illustrated computer. The computer system renders an image (the MRI image) by processing the received signal.

<<Gradient Magnetic Field Coil>>

The gradient magnetic field coil 205 has a function to generate a magnetic field having spatially gradient intensities in order to impart position information to captured data.

Figure 3A:
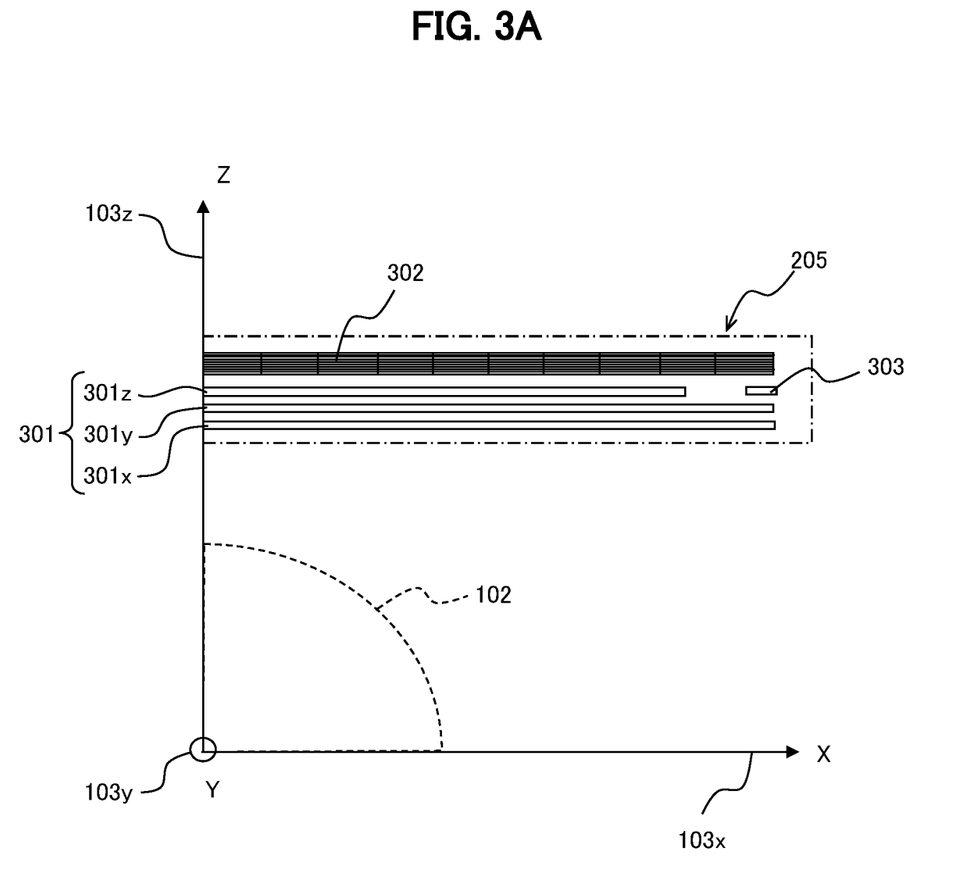
FIG. 3A is a diagram showing a schematic configuration example of a cross-section on XZ plane of the gradient magnetic field coil of the open-type magnetic resonance imaging apparatus according to the first embodiment of the present invention, which is viewed from Y direction.

FIG. 3A is a diagram showing a schematic configuration example of a cross-section on XZ plane of the gradient magnetic field coil of the open-type magnetic resonance imaging apparatus (the open-type MRI apparatus) according to the first embodiment of the present invention, which is viewed from Y direction.

Figure 3B:
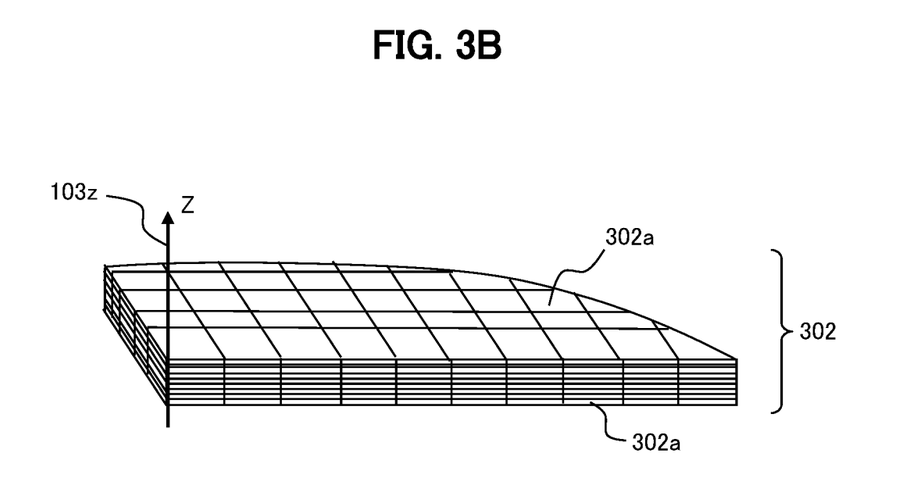
FIG. 3B is a perspective view of the configuration example of the gradient magnetic field coil in FIG. 3A.

FIG. 3B is a perspective view of the configuration example of the gradient magnetic field coil 205 in FIG. 3A.

In FIG. 3A, the gradient magnetic field coil 205 includes gradient magnetic field generation coils 301, a magnetic material block 302, and a correction coil 303.

Moreover, FIG. 3A illustrates the X axis 103x, the Y axis 103y, the Z axis 103z, and the imaging region 102.

The gradient magnetic field coil 205 has a substantially axisymmetric structure with respect to the Z axis 103z as the center.

[Gradient Magnetic Field Generation Coil 301]

In FIG. 3A, the gradient magnetic field coil 205 includes three gradient magnetic field generation coils 301 (an X coil 301x, a Y coil 301y, and a Z coil 301z) stacked in the vertical direction.

The three gradient magnetic field generation coils 301 (the X coil 301x, the Y coil 301y, and the Z coil 301z) independently generate the gradient magnetic fields in three directions (the direction of the X axis 103x, the direction of the Y axis 103y, and the direction of the Z axis 103z) orthogonal to one another in the imaging region 102.

As described above, the gradient magnetic field coil 205 generates the magnetic field having the spatially gradient intensities in order to impart the position information to the captured data.

However, while the gradient magnetic field coil 205 generates the gradient magnetic field in the imaging region, the gradient magnetic field coil 205 also generates a variable magnetic field (a leaked magnetic field) on the outside of the imaging region, which is not necessary for the imaging.

The leaked magnetic field generates an eddy current on a metallic structure such as the static magnetic field magnet, which constitutes the open-type MRI apparatus 100.

The eddy current generates the variable magnetic field in the imaging region, thus affecting distribution of the static magnetic field as well as the gradient magnetic field and causing a deterioration in image quality of the MRI image.

Note that details of the X coil 301x (and the Y coil 301y) will be described later with reference FIGS. 4A and 4B.

Meanwhile, details of the Z coil 301z will be described later with reference FIGS. 5A and 5B.

[Magnetic Material Block 302]

In FIG. 3A, the magnetic material block 302 is provided on one side of the gradient magnetic field generation coil 301 close to the static magnetic field magnet 101.

The magnetic material block 302 includes sheet magnetic materials 302a (FIG. 3B) each of which is a magnetic material having low magnetic resistance.

As shown in FIG. 3B, the sheet magnetic materials 302a are stacked in the direction of the Z axis 103z. Meanwhile, the sheet magnetic materials 302a are formed by arranging the magnetic materials having the low magnetic resistance like tiles in the direction of the X axis 103x and in the direction of the Y axis 103y.

According to the above-described configuration, the magnetic material block 302 has a role for shielding the leaked magnetic field generated on the static magnetic field magnet 101 side by the gradient magnetic field generation coil 301.

Although the material of the magnetic material blocks 302 may be any material as long as it meets performances required for the open-type MRI apparatus 100, a silicon steel plate is desirable in light of high magnetic permeability and high electrical resistance.

Note that large magnetic permeability corresponds to low magnetic resistance.

In addition, a combination of the high electrical resistance and arrangement of the sheet magnetic materials 302a like tiles has an effect of suppressing the occurrence of the eddy current on the magnetic material block 302.

Meanwhile, a thickness of the magnetic material block 302 can be set to any thickness as long as it meets the performances required for the open-type MRI apparatus 100. However, in the case of using the silicon steel plate and considering shield of a magnetic flux that may reach the discoid magnetic pole 201, the magnetic material block 302 preferably has a thickness of at least equal to or above 20 mm.

Inductance of the magnetic material block 302 and inductance of the gradient magnetic field coil 205 are reduced by setting the thickness of the magnetic material block 302 equal to or above 20 mm.

Here, the reduction in inductance of the gradient magnetic field coil 205 reduces a burden on the power supply, thus contributing to a reduction in power supply cost as well.

Figure 4A:
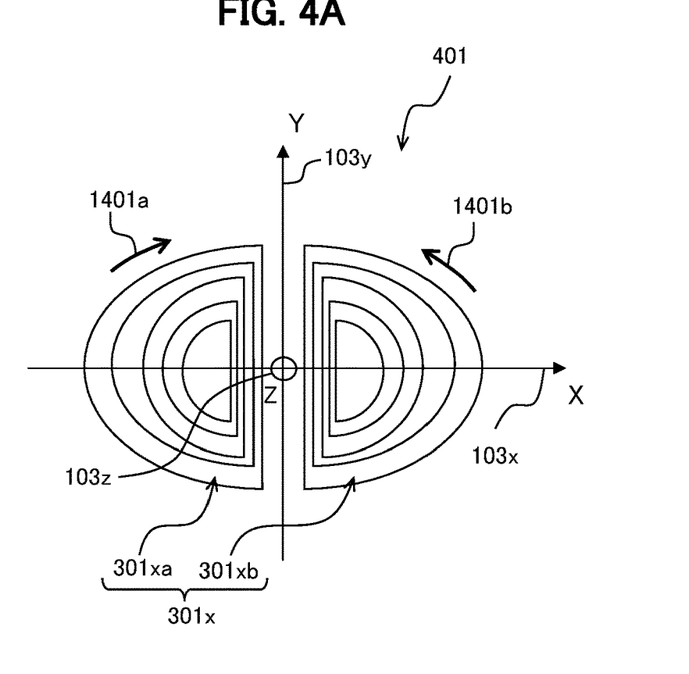
FIG. 4A is a diagram showing a schematic configuration example of a cross-section on an X-Y plane of an X coil in the gradient magnetic field coil of the open-type magnetic resonance imaging apparatus according to the first embodiment of the present invention, which is viewed from Z direction.
Figure 4B:
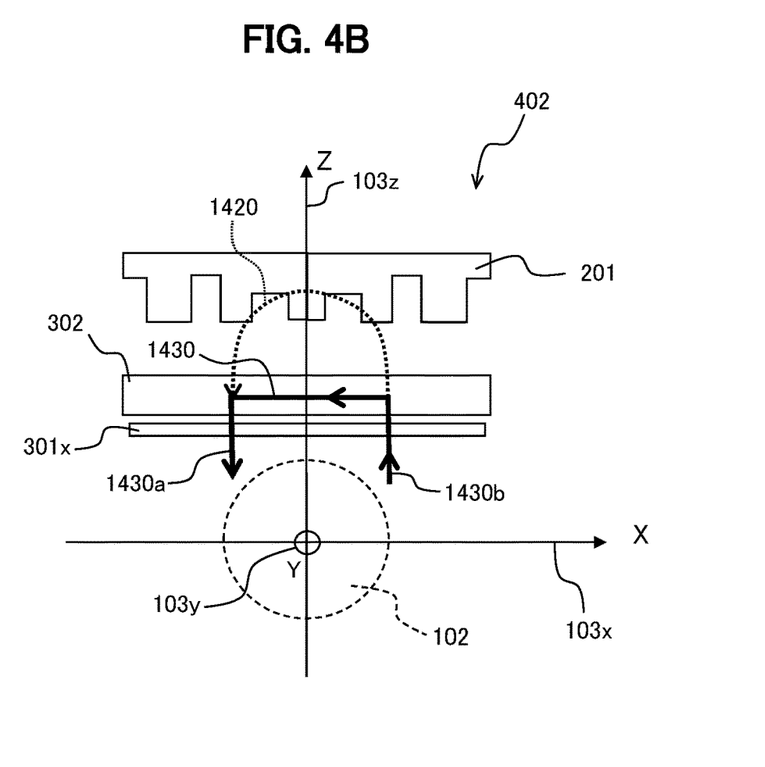
FIG. 4B is a diagram showing a cross-section on XZ plane of an example of a flow of a magnetic flux generated when a pulse current is applied to the X coil in FIG. 4A, which is viewed from Y direction.

Meanwhile, if the magnetic material block 302 is not provided, a magnetic flux (a magnetic field) generated from the gradient magnetic field generation coil 301 (the Z coil 301z) reaches the discoid magnetic pole 201 as shown in FIGS. 4A and 4B to be described later. To prevent this, it is necessary to increase a distance between the gradient magnetic field generation coil 301 and the discoid magnetic pole 201. If the increase in distance is compared with a space in the Z axis direction attributed to the provision of the magnetic material block 302, the provision of the magnetic material block 302 significantly contributes to suppression of the thickness as the static magnetic field magnet 101.

[Correction Coil 303]

In FIG. 3A, the correction coil 303 is annularly provided on the outer periphery of and located at the same height as the Z coil 301z.

The correction coil 303 thus provided has a function to guide the magnetic flux, which is generated from the Z coil 301z and flows along the magnetic material block 302, in an opposite direction to the Z axis 103z. In other words, the correction coil 303 cancels the magnetic flux which is generated from the Z coil 301z and flows along the magnetic material block 302.

A position to install the correction coil 303 may be any position as long as it meets the performances required for the open-type MRI apparatus 100. However, in considering the shield of the magnetic flux that may reach the annular magnetic pole 202, it is desirable to install the correction coil 303 on the outside of the Z coil 301z and at the same height as the Z coil 301z as mentioned above.

[X Coil 301x]

The X coil 301x out of the aforementioned three gradient magnetic field generation coils 301 will be described below in detail with reference to FIGS. 4A and 4B. FIG. 3A has described the configuration of the cross-section on the X-Y plane of the X coil 301x viewed from the Y direction. Next, FIG. 4A will describe the configuration of the cross-section on the X-Y plane of the X coil 301x viewed from the Z direction.

FIG. 4A is a diagram showing a schematic configuration example of an X coil 401 on the X-Y plane, which is a cross-section on the X-Y plane of the X coil 301x in the gradient magnetic field coil 205 of the open-type magnetic resonance imaging apparatus (the open-type MRI apparatus) 100 according to the first embodiment of the present invention viewed from Z direction.

FIG. 4B is a diagram showing a cross-section on XZ plane of an example of a flow of a magnetic flux 402 generated by the X coil 301x when a pulse current is applied to the X coil 301x, which is viewed from Y direction.

In FIGS. 4A and 4B, the X coil 301x generates the gradient magnetic field in the same direction as the Z axis 103z, which is the direction of the static magnetic field relative to the X direction in the imaging region 102 (FIG. 4B).

In FIG. 4A, the X coil 301x includes an X coil 301xa and an X coil 301xb.

The X coil 301xa is located on the left side of the Z axis 103z on the sheet surface. The X coil 301xa is formed by spirally winding a coil. In the X coil 301xa, an electric current flows in a clockwise direction on the sheet surface as indicated with an electric current direction 1401a that represents a direction of flow of the electric current.

The X coil 301xb is located on the right side of the Z axis 103z on the sheet surface. The X coil 301xb is formed by spirally winding a coil. In the X coil 301xb, an electric current flows in a counterclockwise direction on the sheet surface as indicated with an electric current direction 1401b that represents a direction of flow of the electric current.

As a consequence, a direction of the magnetic field (the magnetic flux) generated by the X coil 301xa is opposite to a direction of the magnetic field (the magnetic flux) generated by the X coil 301xb.

In FIG. 4B, the discoid magnetic pole 201, the magnetic material block 302, and the X coil 301x are illustrated as constituents of the X coil 401 on the X-Y plane when the cross-section on the X-Y plane is viewed from the Z direction.

Note that FIG. 4B illustrates the X coil 301x of the gradient magnetic field generation coil 301 but does not illustrate the Y coil 301y or the Z coil 301z.

The X coil 301xb on the right side of the X coil 301x shown in FIG. 4A mainly generates the magnetic flux in a direction of a magnetic flux 1430b in FIG. 4B.

The X coil 301xa on the left side of the X coil 301x shown in FIG. 4A mainly generates the magnetic flux in a direction of a magnetic flux 1430a in FIG. 4B.

As described above with reference to FIG. 4A, the X coil 301xb on the right side and the X coil 301xa on the left side have the directions of the electric currents which are opposite to each other. Accordingly, in FIG. 4B, the magnetic flux directions of the magnetic flux 1430b and the magnetic flux 1430a are opposite to each other.

As a consequence, in FIG. 4B, the magnetic flux 1430b of the X coil 301xb on the right side is directed upward (the positive direction on the Z axis) on the sheet surface. Meanwhile, the magnetic flux 1430a of the X coil 301xa on the left side is directed downward (the negative direction on the Z axis) on the sheet surface.

As described with reference to FIG. 3B, the magnetic material block 302 has the high magnetic permeability and the high electrical resistance, and therefore has the low magnetic resistance.

For this reason, the magnetic flux 1430b generated by the X coil 301xb on the right side and directed upward (the positive direction on the Z axis) on the sheet surface is passed through the magnetic material block 302 having the low magnetic resistance as a magnetic flux 1430 and is directed leftward on the sheet surface (the magnetic flux 1430).

Then, the magnetic flux 1430a generated by the X coil 301xa on the left side is directed downward (the negative direction on the Z axis) on the sheet surface.

Thus, a flow of the magnetic fluxes (1430b, 1430, and 1430a) is generated.

Here, if the magnetic material block 302 being a shield-like magnetic material having the low magnetic resistance is not provided in FIG. 4B, then a magnetic flux 1420 is formed instead of the magnetic flux 1430 as if the magnetic flux 1420 penetrates the magnetic material block 302 and reaches the discoid magnetic pole 201. Such a leaked magnetic field may lead to the occurrence of the eddy current on the discoid magnetic pole 201.

The above-described structure illustrated in FIGS. 4A and 4B prevents the magnetic fluxes of the X coil 301x from reaching a container of the static magnetic field magnet 101 (FIG. 2) or the discoid magnetic pole 201 (FIGS. 2 and 4B), and from generating the eddy current. In other words, this structure suppresses the eddy current attributed to the leaked magnetic field from the gradient magnetic field coil (the X coil 301x).

[Y Coil 301y]

Back to FIG. 3A, the Y coil 301y out of the above-described three gradient magnetic field generation coils 301 will be described.

The flow of the magnetic flux on the Y coil 301y and the above-described flow of the magnetic flux on the X coil 301x are symmetric with respect to the Y axis and the X axis, and the virtually overlapping explanations will be omitted herein.

It is to be noted, however, that the X coil 301x generates the gradient magnetic field in the direction of the X axis whereas the Y coil 301y generates the gradient magnetic field in the direction of the Y axis.

Meanwhile, since the magnetic material block 302 has the discoid shape as shown in FIGS. 3A and 3B, the magnetic material block 302 acts on the Y coil 301y in a similar manner to its action on the X coil 301x.

[Z Coil 301z]

A detailed configuration of the Z coil 301z out of the three gradient magnetic field generation coils 301 shown in FIG. 3A will be described with reference to FIGS. 5A and 5B.

Figure 5A:
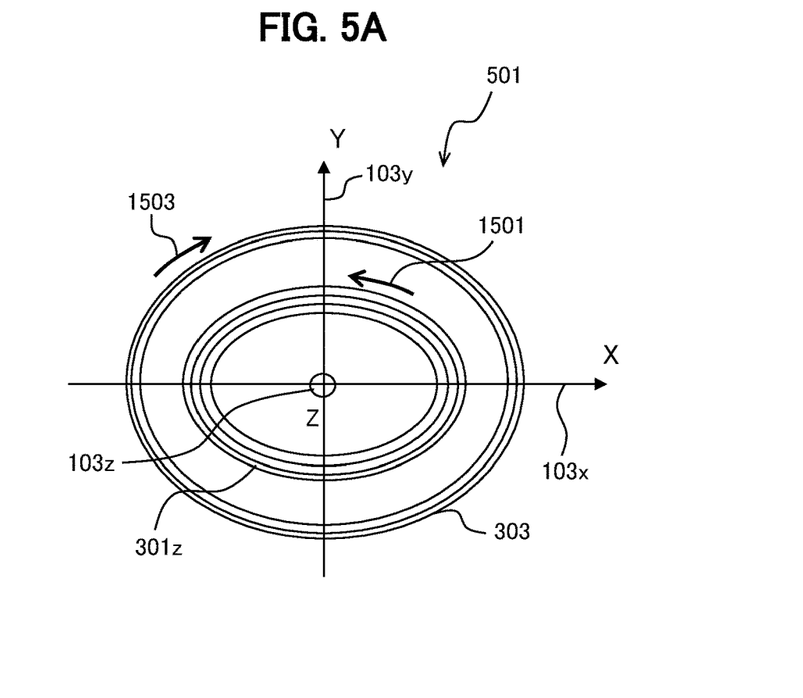
FIG. 5A is a diagram showing a schematic configuration example on the X-Y plane of a Z coil in the gradient magnetic field coil and a correction coil of the open-type magnetic resonance imaging apparatus according to the first embodiment of the present invention.

FIG. 5A is a diagram showing a schematic configuration example of a Z coil 501 on the X-Y plane of the Z coil 301z and of the correction coil 303 in the gradient magnetic field coil 205 of the open-type magnetic resonance imaging apparatus (the open-type MRI apparatus) 100 according to the first embodiment of the present invention.

Figure 5B:
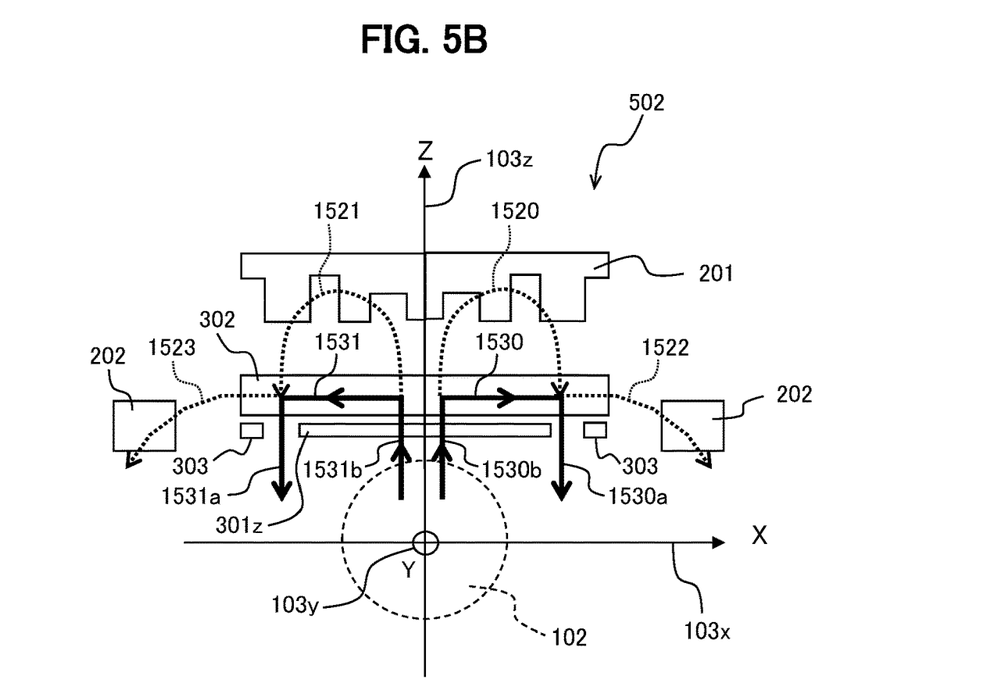
FIG. 5B is a diagram showing an example of flows of magnetic fluxes generated when a pulse current is applied to the Z coil and the correction coil shown in FIG. 5A.

FIG. 5B is a diagram showing an example of a flow of a magnetic flux 502 generated by the Z coil 301z when a pulse current is applied to the Z coil 301z and to the correction coil 303 shown in FIG. 5A.

The Z coil 301z generates the gradient magnetic field on the imaging region 102 side in the same direction as the direction of the static magnetic field (the direction of the Z axis 103z) with respect to the Z direction.

In FIG. 5A, an electric current direction 1501 of an electric current that flows on the Z coil 301z formed by being annularly wound several times is an opposite direction to an electric current direction 1503 of an electric current that flows on the correction coil 303 formed by being annularly wound several times.

When the electric current is applied in the electric current direction 1501 to the Z coil 301z in FIG. 5A around the Z axis as the center, magnetic fluxes (1530b and 1531b) are generated in an upward direction along the Z axis from the vicinity of the center of the Z axis on the sheet surface.

The magnetic flux 1530b and the magnetic flux and 1531b that advance in the same direction are in a sort of mutually repulsive relation. Accordingly, when the magnetic fluxes (1530b and 1531b) reach the magnetic material block 302 having the low magnetic resistance, the magnetic fluxes advance separately in radial directions inside the magnetic material block 302 having the low magnetic resistance.

In other words, in FIG. 5B that illustrates the XZ plane, a magnetic flux 1530 is illustrated in such a way as to advance rightward in the magnetic material block 302 on the sheet surface while a magnetic flux 1531 is illustrated in such a way as to advance leftward in the magnetic material block 302 on the sheet surface.

When the magnetic fluxes reach ends (a right end and a left end on the outer periphery) of the magnetic material block 302, the correction coil 303 is located in the vicinity of the respective ends.

As shown in FIG. 5A, the electric current direction 1501 of the electric current flowing on the Z coil 301z is the opposite direction to the electric current direction 1503 of the electric current flowing on the correction coil 303.

For this reason, the magnetic fluxes (1530 and 1531) from the Z coil 301z are bent, respectively, by the action of the correction coil 303.

Specifically, the magnetic flux 1530 is directed downward on the sheet surface at the right end (in the vicinity of the correction coil 303) of the Z coil 301z as a magnetic flux 1530a.

Meanwhile, the magnetic flux 1531 is directed downward on the sheet surface at the left end (in the vicinity of the correction coil 303) of the Z coil 301z as a magnetic flux 1531a.

The above-described configuration prevents the magnetic fluxes from reaching the container of the static magnetic field magnet 101, the discoid magnetic pole 201, or the annular magnetic pole 202. As a consequence, the occurrence of the eddy current on any of the container of the static magnetic field magnet 101, the discoid magnetic pole 201, and the annular magnetic pole 202 is suppressed.

Here, if the magnetic material block 302 is not provided, the magnetic flux 1530 and the magnetic flux 1531 in FIG. 5B may reach the discoid magnetic pole 201 as indicated as a magnetic flux 1520 and a magnetic flux 1521, respectively, and may lead to the occurrence of the eddy current on the discoid magnetic pole 201.

On the other hand, if the correction coil 303 is not provided, the magnetic flux 1530a and the magnetic flux 1531a may reach the annular magnetic pole 202 as indicated as a magnetic flux 1522 and a magnetic flux 1523, respectively, and may lead to the occurrence of the eddy current on the annular magnetic pole 202.

In other words, the magnetic fluxes generated by the Z coil 301z may not be able to achieve desired characteristics.

As described above, the occurrence of the eddy current in the discoid magnetic pole 201 is prevented and a deterioration of an MRI image is reduced by retaining the magnetic flux 1530 and the magnetic flux 1531 inside the magnetic material block 302 so as not to reach the discoid magnetic pole 201.

Meanwhile, the occurrence of the eddy current in the annular magnetic pole 202 is prevented and the deterioration of the MRI image is reduced by keeping the magnetic flux 1530a and the magnetic flux 1531a from reaching the annular magnetic pole 202 by the action of the correction coil 303.

<Summary of First Embodiment>

According to the open-type MRI apparatus (the open-type MRI apparatus) of this configuration, it is possible to suppress the eddy current attributed to the leaked magnetic field from the gradient magnetic field coil and to improve image quality of the MRI image without dividing the magnetic pole that constitutes the static magnetic field magnet.

Moreover, since the magnetic pole constituting the static magnetic field magnet is not divided, it is possible to achieve a prescribed magnetic field intensity with lower magnetic energy as compared to the case of dividing the magnetic pole.

Furthermore, since the magnetic pole constituting the static magnetic field magnet is not divided, the open-type magnetic resonance imaging apparatus is realized at low costs without requiring high processing and assembling accuracy.

<Advantageous Effects of First Embodiment>

According to the open-type MRI apparatus (the open-type MRI apparatus) of the first embodiment of the present invention, it is possible to suppress the eddy current attributed to the leaked magnetic field from the gradient magnetic field coil and to improve image quality of the MRI image without dividing the magnetic pole that constitutes the static magnetic field magnet.

Meanwhile, since the magnetic pole constituting the static magnetic field magnet is not divided, it is possible to achieve a prescribed magnetic field intensity with lower magnetic energy as compared to the case of dividing the magnetic pole.

In the meantime, since the magnetic pole constituting the static magnetic field magnet is not divided, the open-type magnetic resonance imaging apparatus is realized at low costs without requiring high processing and assembling accuracy.

Meanwhile, since the imaging region 102 of the open-type MRI apparatus 100 is not surrounded by structures, the test subject 104 can feel freedom as compared to a horizontal magnetic field-type MRI apparatus.

In the meantime, it is possible to capture an image of an affected area of the test subject 104 always at the center of the imaging region 102 by moving the movable bed 105.

Meanwhile, the open-type MRI apparatus 100 has an advantage that an operator of the open-type MRI apparatus 100 or the like can assist in capturing the image of the test subject 104 from the outside of the open-type MRI apparatus 100 in the course of capturing the MRI image.

Other Embodiments

It is to be noted that the present invention is not limited only to the above-described embodiment and that the present invention further encompasses various modified examples. For instance, the aforementioned embodiment has been described in detail in order to clearly explain the present invention, and the present invention is not limited to the configuration that includes all of the structures described above. Moreover, it is possible to replace part of the configurations of one embodiment with part of the configurations of another embodiment. Furthermore, it is also possible to add, delete, or replace part or all of the configurations of the one embodiment to or from the configurations of the other embodiment.

Other embodiments and modified examples will be further described below.

<<Shield Coil>>

FIG. 2 has described the case where the shield coil 203 in the static magnetic field magnet 101 is located on a radially outer side of the discoid magnetic pole 201.

However, the location of the shield coil 203 is not limited to the radially outer side of the discoid magnetic pole 201. For example, the shield coil 203 may be located at a position on a radially inner side of the discoid magnetic pole 201 and above the discoid magnetic pole 201. Alternatively, two or more shield coils may be provided at two or more locations.

The configuration and the location of the shield coil 203 may be selected such that the shield coil 203 exerts the action to reduce the leaked magnetic field on the outside of the open-type MRI apparatus 100, which may be generated by the magnetic circuit of any of the discoid magnetic pole 201 and the annular magnetic pole 202.

<<Generation of Static Magnetic Field>>

FIG. 2 has described the concept of generating the static magnetic field by using the main coil 204 having the substantially annular shape and adopting the electrically conductive material (such as the superconductive material). However, the generation of the static magnetic field is not limited to the method of using the main coil 204 having the annular shape.

For example, a magnetic field corresponding to the magnetic field to be generated by the main coil 204 having the annular shape may be generated by using a magnetized permanent magnet (not shown).

<<Magnetic Material Block>>

The sheet magnetic materials 302a constituting the magnetic material block 302 are illustrated as square tiles in FIG. 3B. However, the shape of the tile of each sheet magnetic material 302a is not limited to a square shape and the sheet magnetic material 302a may be formed into a hexagonal shape, for example.

Meanwhile, the mode of stacking layers of the sheet magnetic materials 302a is not limited to a method of aligning the shapes of the upper and lower tiles. The sheet magnetic materials 302a may be stacked such that the upper and lower tiles are displaced from each other.

In the meantime, regarding the shapes of the tiles of the sheet magnetic materials 302a, the shape of a tile located at a central part of the magnetic material block 302 may be different from the shape of a tile located at an end part (a peripheral part) of the magnetic material block 302.

<<MRI Apparatuses Other than Open Type>>

The configuration of the first embodiment including the static magnetic magnet and the gradient magnetic field coil has been described with reference to FIGS. 1 and 2 as the configuration suitable for the open-type magnetic resonance imaging apparatus (the open-type MRI apparatus). However, the configuration including the static magnetic magnet and the gradient magnetic field coil shown in FIG. 1 is applicable to one not adopting the open type.

In other words, the above-described configuration of the low-cost MRI apparatus that suppresses the eddy current attributed to the leaked magnetic field from the gradient magnetic field coil and improves the image quality of the MRI image is applicable not only to MRI apparatuses of the open type but also to MRI apparatuses of non-open types.

What is claimed is:

1. An open-type magnetic resonance imaging apparatus comprising:
   a pair of static magnetic field magnets opposed to each other with respect to an imaging region; and
   a pair of gradient magnetic field coils opposed to each other with respect to the imaging region, wherein
   each static magnetic field magnet includes
      a discoid magnetic pole configured to generate a static magnetic field in a Z axis direction in which the pair of static magnetic field magnets are opposed each other, and
      an annular magnetic pole configured to generate a static magnetic field on an X-Y plane perpendicular to the Z axis direction, and
   each gradient magnetic field coil includes
      a Z coil configured to provide a magnetic field being gradient in the Z axis direction in the imaging region,
      a magnetic material block configured to shield the discoid magnetic pole from a magnetic flux generated from the Z coil, and
      a correction coil configured to shield the annular magnetic pole from the magnetic flux generated from the Z coil.

2. The open-type magnetic resonance imaging apparatus according to claim 1, wherein
   the each static magnetic field magnet includes:
   an annular main coil configured to generate the static magnetic field in the Z axis direction; and
   a shield coil configured to reduce a magnetic field outside the open-type magnetic resonance imaging apparatus.

3. The open-type magnetic resonance imaging apparatus according to claim 2, wherein the shield coil is arranged radially outside of the main coil and configured to generate a magnetic field which has an opposite polarity to a polarity of the magnetic field in the imaging region.

4. The open-type magnetic resonance imaging apparatus according to claim 2, wherein
the correction coil is arranged radially outside of the Z coil, and
the correction coil is arranged at the same height in the Z axis direction as the Z coil.

5. The open-type magnetic resonance imaging apparatus according to claim 1, wherein
the each gradient magnetic field coil includes:
an X coil configured to provide a magnetic field being gradient in an X axis direction in the imaging region; and
a Y coil configured to provide a magnetic field being gradient in a Y axis direction in the imaging region.

6. The open-type magnetic resonance imaging apparatus according to claim 5, wherein
the correction coil is arranged radially outside of the Z coil, and
the correction coil is arranged at the same height in the Z axis direction as the Z coil.

7. The open-type magnetic resonance imaging apparatus according to claim 5, wherein
the each X coil includes two coils which are arranged in the X axis direction with the Z axis interposed between the two coils, and
the each Y coil includes two coils arranged in the Y axis direction with the Z axis interposed between the two coils.

8. The open-type magnetic resonance imaging apparatus according to claim 1, further comprising:
an RF coil configured to apply a radiofrequency electromagnetic pulse to the static magnetic field in the imaging region.

9. The open-type magnetic resonance imaging apparatus according to claim 8, further comprising:
a receiver coil configured to receive a magnetic resonance-related signal from a test subject in response to application of a radiofrequency electromagnetic pulse to the test subject by the RF coil.

10. The open-type magnetic resonance imaging apparatus according to claim 1, further comprising:
a movable bed configured to convey a test subject into the imaging region of the open-type magnetic resonance imaging apparatus.

11. The open-type magnetic resonance imaging apparatus according to claim 1, wherein
the correction coil is arranged radially outside of the Z coil, and
the correction coil is arranged at the same height in the Z axis direction as the Z coil.

12. The open-type magnetic resonance imaging apparatus according to claim 1, wherein
the each magnetic material block includes sheet magnetic materials which are stacked on each other in the Z axis direction and arranged side by side in a tile-like formation in an X axis direction and in a Y axis direction perpendicular to the Z axis direction.

13. The open-type magnetic resonance imaging apparatus according to claim 12, wherein
the sheet magnetic material of the magnetic material block includes a silicon steel plate.

14. The open-type magnetic resonance imaging apparatus according to claim 12, wherein
the magnetic material block has a thickness of 20 mm or more.

15. The open-type magnetic resonance imaging apparatus according to claim 1, wherein
the Z coil is formed in an annular shape about the Z axis.

* * * * *